(12) United States Patent
Choi et al.

(10) Patent No.: US 11,107,790 B2
(45) Date of Patent: Aug. 31, 2021

(54) LASER BONDING METHOD

(71) Applicant: Electronics and Telecommunications Research Institute, Daejeon (KR)

(72) Inventors: Kwang-Seong Choi, Daejeon (KR); Yong Sung Eom, Daejeon (KR); KeonSoo Jang, Daejeon (KR); Seok-Hwan Moon, Daejeon (KR); Hyun-cheol Bae, Sejong-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/555,060

(22) Filed: Aug. 29, 2019

(65) Prior Publication Data

US 2020/0075535 A1  Mar. 5, 2020

(30) Foreign Application Priority Data

Sep. 3, 2018  (KR) .................. 10-2018-0104616
Feb. 7, 2019  (KR) .................. 10-2019-0014642

(51) Int. Cl.
*H01L 23/00* (2006.01)

(52) U.S. Cl.
CPC .............. *H01L 24/83* (2013.01); *H01L 24/29* (2013.01); *H01L 24/32* (2013.01); *H01L 2224/29309* (2013.01); *H01L 2224/29311* (2013.01); *H01L 2224/29313* (2013.01); *H01L 2224/29339* (2013.01); *H01L 2224/29344* (2013.01);
(Continued)

(58) Field of Classification Search
CPC ........................................... H01L 2224/83203
See application file for complete search history.

(56) References Cited

U.S. PATENT DOCUMENTS 9,853,010 B2   12/2017  Choi et al.
2009/0311810 A1  12/2009  Yang et al.
(Continued)

FOREIGN PATENT DOCUMENTS

KR       101245356 B1   3/2013
KR    1020160059562 A   5/2016

OTHER PUBLICATIONS

Jung-Hun Seo, et al., "A Simplified Method of Making Flexible Blue LEDs on a Plastic Substrate", IEEE Photonics Journal, vol. 7, No. 2, Apr. 2015.

*Primary Examiner* — Julio J Maldonado
*Assistant Examiner* — Mohammad A Rahman
(74) *Attorney, Agent, or Firm* — Rabin & Berdo, P.C.

(57) ABSTRACT

A laser bonding method includes forming a bonding part including an adhesive layer and a conductive particle disposed within the adhesive layer on a substrate; aligning a bonding target by disposing the bonding target on a surface of the bonding part opposite the substrate; disposing a pressing part on a surface of the bonding target that is opposite to the bonding part and pressing the bonding target onto the bonding part through the pressing part; heating the bonding target by irradiating at least the pressing part with a laser and conducting heat from the pressing part to the bonding target and from the bonding target to the bonding part; and bonding together the bonding part and the bonding target by the heat conducted from the bonding target to the bonding part so that the conductive particle electrically connects the substrate and the bonding target. The pressing part may be removed.

15 Claims, 7 Drawing Sheets

(52) U.S. Cl.
    CPC ........... *H01L 2224/29347* (2013.01); *H01L 2224/29486* (2013.01); *H01L 2224/32227* (2013.01); *H01L 2224/32503* (2013.01); *H01L 2224/8381* (2013.01); *H01L 2224/83203* (2013.01); *H01L 2224/83224* (2013.01)

(56) References Cited

U.S. PATENT DOCUMENTS

| | | |
|---|---|---|
| 2011/0260179 A1 | 10/2011 | Hung |
| 2012/0118480 A1* | 5/2012 | Paik .............. C09J 5/06 156/73.1 |
| 2015/0228617 A1* | 8/2015 | Lee ............... H01L 24/29 257/772 |
| 2016/0143174 A1 | 5/2016 | Cho |
| 2017/0062379 A1* | 3/2017 | Zhang ............ H01L 24/29 |
| 2017/0141071 A1* | 5/2017 | Choi .............. H01L 25/50 |
| 2018/0269174 A1* | 9/2018 | Fathi ............. B22F 5/04 |

* cited by examiner

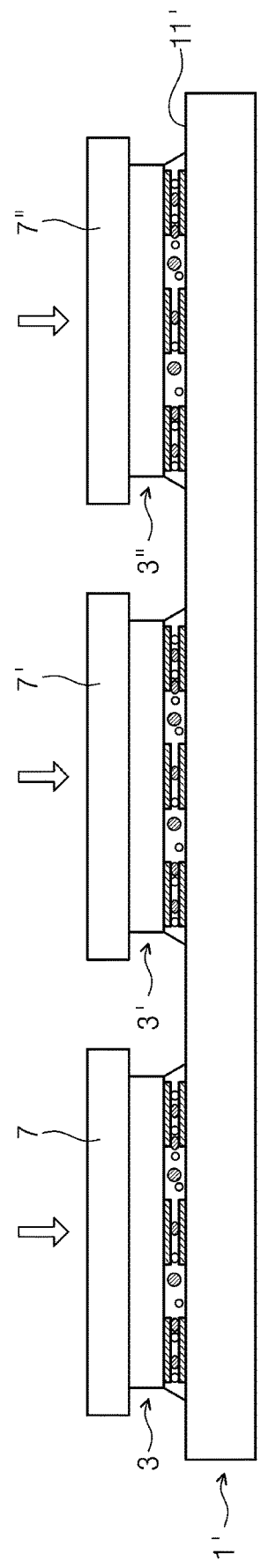
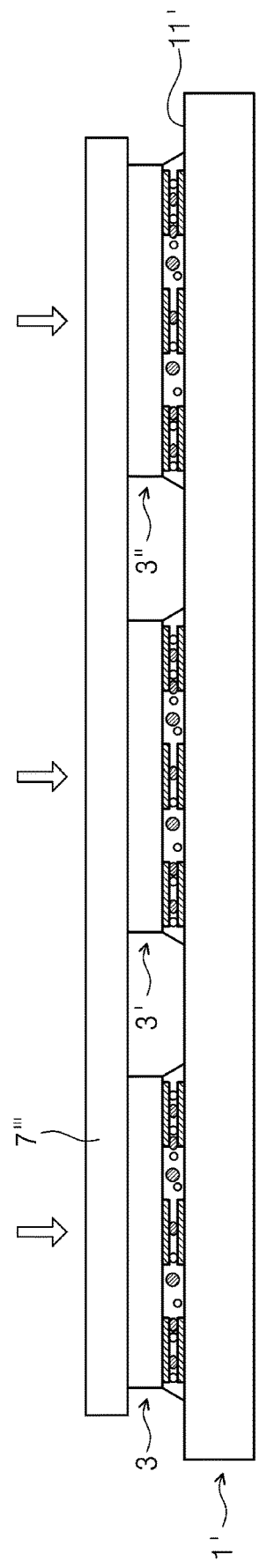

LASER BONDING METHOD

CROSS-REFERENCE TO RELATED APPLICATIONS

This U.S. non-provisional patent application claims priority under 35 U.S.C. § 119 of Korean Patent Application Nos. 10-2018-0104616, filed on Sep. 3, 2018, and 10-2019-0014642, filed on Feb. 7, 2019, the entire contents of which are hereby incorporated by reference.

BACKGROUND

The present disclosure herein relates to a laser bonding method, and more particularly, to a laser bonding method that may be used for bonding semiconductor devices and the like.

With the development of the electronic industry, there is a growing demand for high-performance, high-speed and miniaturization of electronic components. According to this trend, the size of a connection part connecting a chip and a substrate is also becoming smaller.

Solder bumps may be used to connect the chip and the substrate. In order to connect the chip to the substrate using solder bumps, it may be necessary to apply heat. When heat is applied during the packaging process, a warpage phenomenon occurs or part of each part is damaged due to a difference in thermal expansion coefficient between the parts. That is, the function of the part may be lost.

SUMMARY

The present disclosure is to provide a laser bonding method capable of bonding at a low temperature.

The present disclosure is also to provide a laser bonding method capable of bonding a fine-size solder.

The present disclosure is also to provide a laser bonding method capable of preventing a warp phenomenon.

The present disclosure is also to provide a laser bonding method capable of preventing component damage due to heat.

An embodiment of the inventive concept provides a laser bonding method including: forming a bonding part on a substrate; aligning a bonding target on the bonding part; and bonding the bonding part and the bonding target, wherein the bonding includes heating the bonding part using a laser, wherein the bonding part formed on the substrate includes an adhesive layer and a conductive particle located in the adhesive layer.

In an embodiment, the bonding may include: bonding an upper part of the conductive particle to a pad of the bonding target; and bonding a lower part of the conductive particle to a pad of the substrate.

In an embodiment, the conductive particle may be provided in plurality.

In an embodiment, the bonding of the upper part of the conductive particle to the pad of the bonding target may include forming an upper intermetallic compound by the upper part of the conductive particle and the pad of the bonding target, wherein the bonding of the lower part of the conductive particle to the pad of the bonding target may include forming a lower intermetallic compound by the lower part of the conductive particle and the pad of the bonding target.

In an embodiment, the bonding may further include pressing the bonding target through the pressing part.

In an embodiment, the pressing part may include a quartz.

In an embodiment, the bonding part may further include a spacer provided in the adhesive layer.

In an embodiment, the bonding part may further include a reducing agent, wherein the bonding may further include removing an oxide film of each of the conductive particle, the pad of the bonding target, and the pad of the substrate by the reducing agent.

In an embodiment, the conductive particles may include a solder.

In an embodiment of the inventive concept, a laser bonding method includes: forming a bonding part on a substrate; aligning a bonding target on the bonding part; and bonding the bonding part and the bonding target, wherein the bonding includes heating the bonding part using a laser, wherein the bonding part formed on the substrate includes an adhesive layer and a conductive particle located in the adhesive layer.

In an embodiment, the spacer may be disposed between a pad of the bonding target and a pad of the substrate to maintain a distance between the pad of the bonding target and the pad of the substrate.

In an embodiment, the spacer may include a polymer, a ceramic or a metal covered with an oxide film.

In an embodiment, the bonding part may include a conductive particle provided in the adhesive layer.

In an embodiment, the bonding may include: bonding an upper part of the conductive particle to a pad of the bonding target; and bonding a lower part of the conductive particle to a pad of the substrate.

In an embodiment, the bonding of the upper part of the conductive particle to the pad of the bonding target may include forming an upper intermetallic compound by the upper part of the conductive particle and the pad of the bonding target, wherein the bonding of the lower part of the conductive particle to the pad of the bonding target may include forming a lower intermetallic compound by the lower part of the conductive particle and the pad of the bonding target.

In an embodiment of the inventive concept, a semiconductor package includes: a substrate; a bonding part formed on the substrate; and a bonding target on the bonding part, wherein the bonding part includes a conductive particle electrically connecting a pad of the substrate and a pad of the bonding target and a spacer disposed between the pad of the substrate and the pad of the bonding target.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 11 is a cross-sectional view illustrating a laser bonding method according to embodiments of the inventive concept; and FIG. 12 is a cross-sectional view illustrating a laser bonding method according to embodiments of the inventive concept.

DETAILED DESCRIPTION

Figure 1:
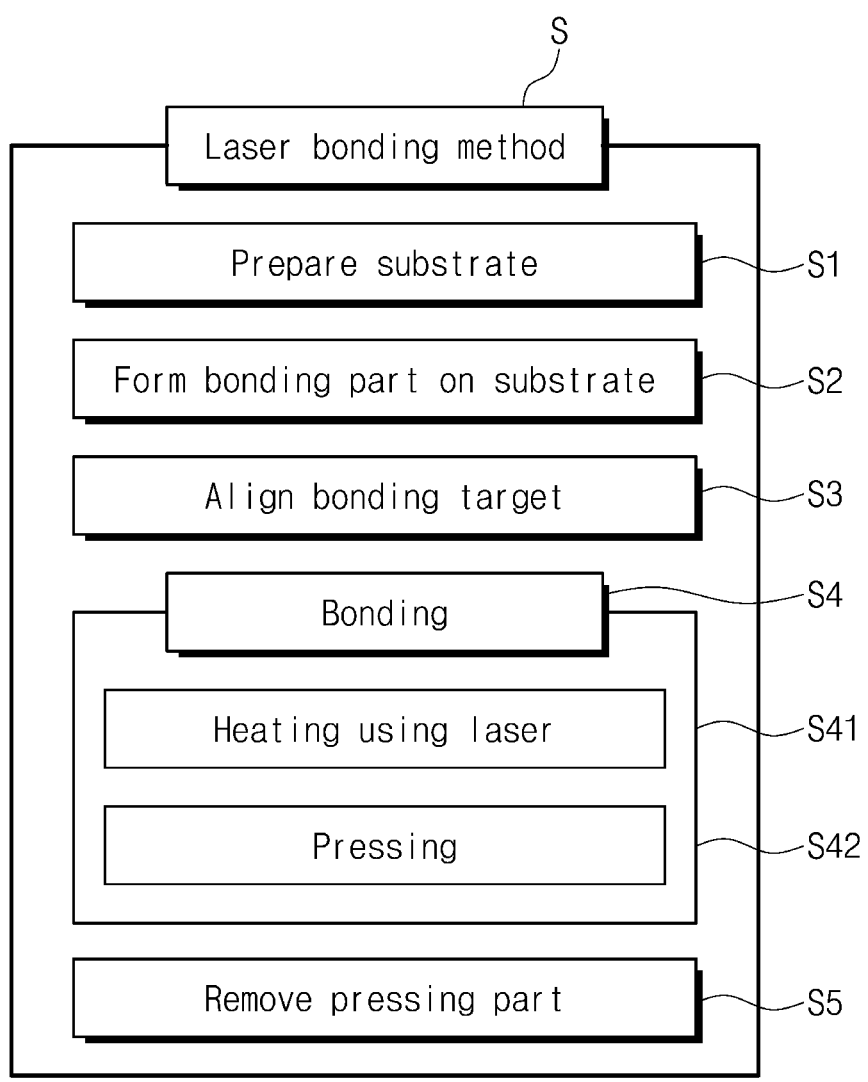
FIG. 1 is a flowchart illustrating a laser bonding method according to exemplary embodiments of the inventive concept.

In order to fully understand the configuration and effects of the technical spirit of the inventive concept, preferred embodiments of the technical spirit of the inventive concept will be described with reference to the accompanying drawings. However, the technical spirit of the inventive concept is not limited to the embodiments set forth herein and may be implemented in various forms and various modifications may be applied thereto. Only, the technical spirit of the inventive concept is disclosed to the full through the description of the embodiments, and it is provided to those skilled in the art that the inventive concept belongs to inform the scope of the inventive concept completely.

Like reference numerals refer to like elements throughout the specification. Embodiments described herein will be described with reference to a perspective view, a front view, a sectional view, and/or a conceptual view, which are ideal examples of the technical idea of the inventive concept. In the drawings, the thicknesses of areas are exaggerated for effective description. Areas exemplified in the drawings have general properties, and are used to illustrate a specific shape of a semiconductor package region. Thus, this should not be construed as limited to the scope of the inventive concept. It will be understood that various terms are used herein to describe various components but these components should not be limited by these terms. These terms are just used to distinguish a component from another component. Embodiments described herein include complementary embodiments thereof.

The terms used in this specification are used only for explaining specific embodiments while not limiting the inventive concept. The terms of a singular form may include plural forms unless referred to the contrary. The meaning of "comprises," and/or "comprising" in this specification specifies the mentioned component but does not exclude at least one another component.

Hereinafter, preferred embodiments of the technical spirit of the inventive concept are described with reference to the accompanying drawings so that the inventive concept is described in more detail.

FIG. 1 is a flowchart illustrating a laser bonding method according to exemplary embodiments of the inventive concept.

Referring to FIG. 1, a laser bonding method S according to embodiments of the inventive concept may include preparing a substrate (S1), forming a bonding part on the substrate (S2), aligning a bonding target (S3), bonding (S4), and removing a pressing part (S5). Hereinafter, these methods will be described in detail with reference to FIGS. 2 to 7.

FIGS. 2 to 7 are cross-sectional views sequentially showing the laser bonding method of FIG. 1.

Hereinafter, the lower direction of FIG. 2 may be referred to as a first direction D1, the right direction may be referred to as a second direction D2, a direction that is substantially orthogonal to the first direction D1 and the second direction D2 and faces the front may be referred to as a third direction D3.

Figure 2:
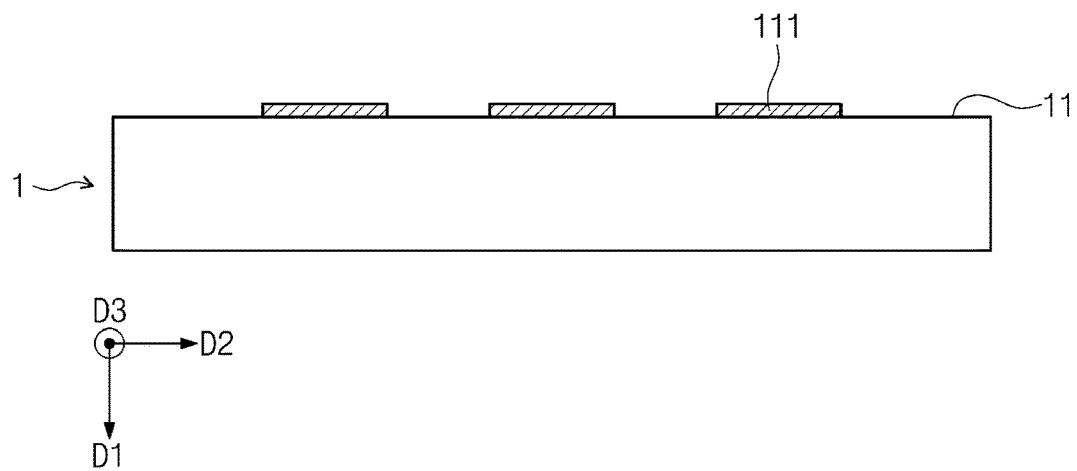
FIGS. 2 to 7 are cross-sectional views sequentially showing the laser bonding method of FIG. 1.

Referring to FIGS. 1 and 2, a substrate 1 may be provided in the preparing of the substrate (S1). In embodiments, the substrate 1 may include a printed circuit board (PCB) or the like. A pad 111 may be provided on the upper surface 11 of the substrate 1. The pad 111 may include a conductive material. In embodiments, the pad 111 may include copper (Cu), aluminum (Al), and the like. The components outside the substrate 1 and the circuits (not shown) inside the substrate 1 may be electrically connected through the pad 111. The meaning of a connection as used in this specification may include both a direct connection or an indirect connection through another configuration. The pad 111 may protrude from the upper surface 11 of the substrate 1 in a direction opposite to the first direction D1. However, the inventive concept is not limited thereto, and the pad 111 may be embedded in the first direction D1 in the upper surface 11. The pad 111 may be provided in plurality. Each of the pads 111 may be spaced in the second direction D2.

Figure 3:
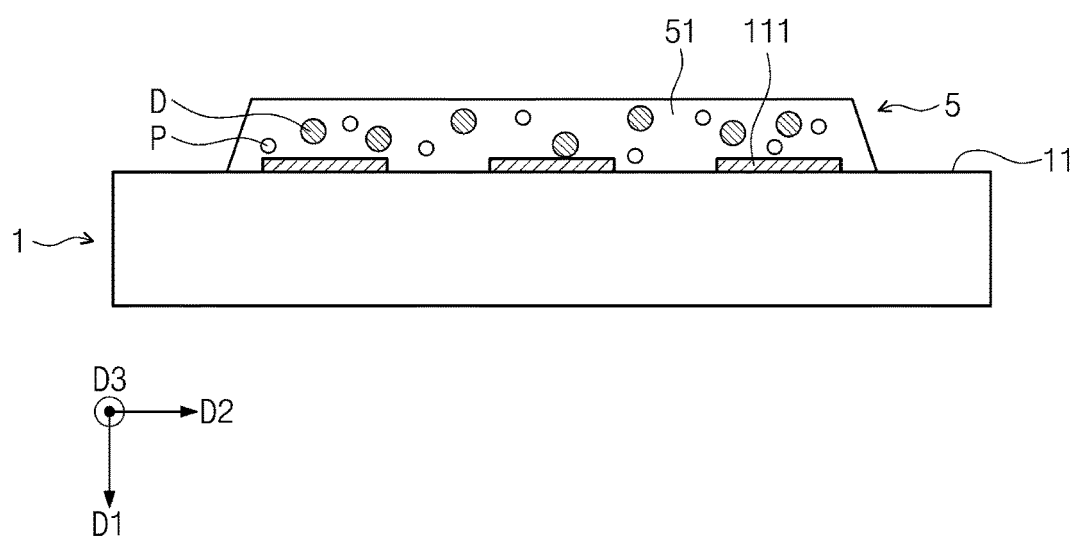

Referring to FIGS. 1 and 3, the bonding part 5 may be formed on the substrate 1 in the forming of the bonding part on the substrate (S2). More specifically, the bonding part 5 may be formed on part or all of the upper surface 11.

The bonding part 5 may include an adhesive layer 51, and a conductive particle D and a spacer P located inside the adhesive layer 51. The adhesive layer 51 may cover the pad 111. In embodiments, the adhesive layer 51 may include a non-conductive film (NCF) or a non-conductive paste (NCP). The NCF or the NCP may include a resin, a hardener, a reducing agent, and the like. The conductive particle D may be provided in the adhesive layer 51. The conductive particle D may be a particle in which a conductive material is aggregated. The diameter of the conductive particle D may be slightly larger than the distance between the pad 111 of the substrate 1 and the pad 311 of the bonding target 3 in the state where the bonding is completed. Detailed description for this will be made later. The conductive particle D may include solder. The solder may include tin (Sn) and/or indium (In). More specifically, the conductive particle D may include SnBi, SnAgCu, SnAg, AuSn, InSn, BiInSn, and the like. However, the inventive concept is not limited thereto, and the conductive particle D may include another conductive material. The conductive particle D may be provided in plurality. More specifically, the number of conductive particles D may be greater than or equal to the number of pads 111 of the substrate 1. The conductive particles D may be dispersed within the adhesive layer 51. The conductive particles D may be dispersed within the adhesive layer 51 while spaced apart from each other. The spacer P may be slightly smaller than the conductive particle D. The spacer P may include a polymer, a ceramic, a metal, or the like. When the spacer P includes a metal, the surface of the metal may be covered with an oxide film or an organic material. Therefore, the spacer P may be electrically insulated. The spacer P may be provided in plurality. More specifically, the number of spacers P may be greater than or equal to the number of pads 111 of the substrate 1. The spacers P may be dispersed within the adhesive layer 51. The spacers P may be dispersed within the adhesive layer 51 while spaced apart from one another. The conductive particles D and the spacers P may all be dispersed apart from each other within the adhesive layer 51.

Figure 4:
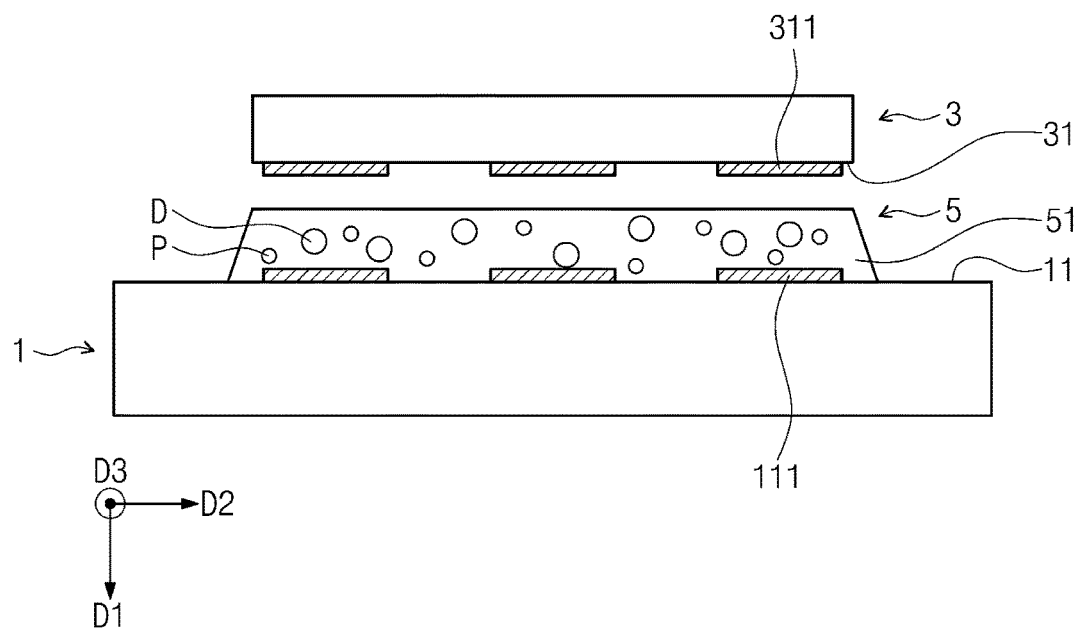

Referring to FIGS. 1 and 4, in the aligning of the bonding target (S3), the bonding target 3 may be disposed on the bonding part 5. In embodiments, the bonding target 3 may include a semiconductor chip. A pad 311 may be provided on the lower surface 31 of the bonding target 3. The pad 311 may protrude from the lower surface 31 in the first direction D1 by a predetermined length. However, the inventive concept is not limited thereto, and the pad 311 may be embedded in the lower surface 31 in the opposite direction to the first direction D1. The pad 311 may include a conductive material. In embodiments, the pad 311 may include, copper (Cu) or aluminum (Al). In embodiments, the pad 311 may be provided in plurality. Each of the pads 311 may be spaced in the second direction D2.

Figure 5:
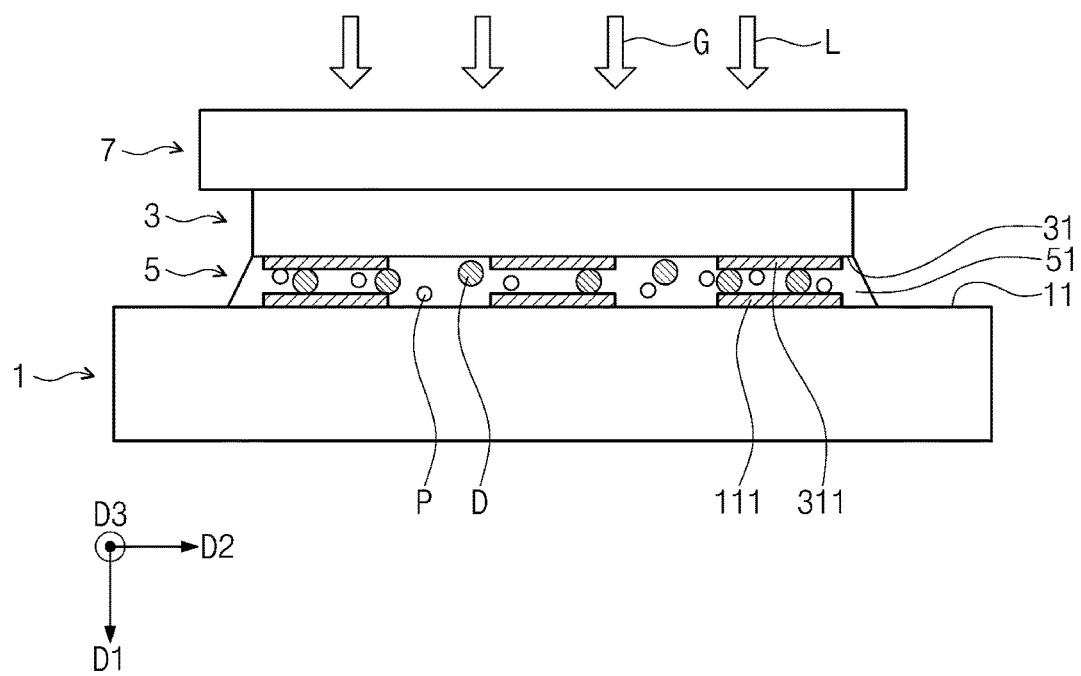

Referring to FIGS. 1 and 5, the bonding (S4) may include heating using laser (S41) and pressing (S42). In the heating using the laser (S41), the bonding target 3 may be irradiated with a laser L. The temperature of the bonding target 3 may be raised by the laser L. If the temperature of the bonding target 3 rises, the temperature of the bonding part 5 may also rise. More specifically, the temperature of the adhesive layer 51 and/or the conductive particle D may rise. In embodiments, the oxidizing film may be removed from the pad 111 of the substrate 1 and the pad 311 of the bonding target 3 by the reducing agent. The pad 311 of the bonding target 3 and the pad 111 of the substrate 1 may be electrically connected by the conductive particle D.

One conductive particle D may be positioned between the pad 311 of the bonding target 3 and the pad 111 of the substrate 1. In the embodiments, each conductive particle D may be positioned between the pads 311 of the bonding target 3 and the pads 111 of the substrate 1 in the second direction D2. However, the inventive concept is not limited thereto. That is, a plurality of conductive particles D may be positioned between the pad 311 of the bonding target 3 and the pad 111 of the substrate 1. In this case, the conductive particles D may be spaced or contacted in the second direction D2.

In the pressing (S41), the pressing part 7 may be placed on the bonding target 3. A force G may be applied through the pressing part 7 in the first direction D1. When the pressing part 7 evenly presses the upper surface of the bonding target 3, the warpage phenomenon of the bonding target 3 and the substrate 1 may be prevented. In embodiments, the pressing part 7 may include a quartz. The laser L may be irradiated onto the bonding target 3 through the pressing part 7. Quartz may hardly absorb the laser L. By using quartz, the loss of the laser L may be reduced. The efficiency of heating by the laser L may be improved. By the pressing of the pressing part 7, the bonding target 3 may move in the first direction D1. The lower surface 31 of the bonding target 3 and the pad 311 may press the bonding part 5. The shape of the adhesive layer 51 may vary. The conductive particle D may be positioned between the pad 311 of the bonding target 3 and the pad 111 of the substrate 1. The upper end of the conductive particle D may be in contact with the pad 311 of the bonding target 3. The lower end of the conductive particle D may be in contact with the pad 111 of the substrate 1.

One spacer P may be positioned between the pad 311 of the bonding target 3 and the pad 111 of the substrate 1. In the embodiments, each spacer P may be positioned between the pads 311 of the bonding target 3 and the pads 111 of the substrate 1 in the second direction D2. However, the inventive concept is not limited thereto. That is, a plurality of spacers P may be positioned between the pad 311 of the bonding target 3 and the pad 111 of the substrate 1. In this case, the spacers P may be spaced or contacted in the second direction D2.

Figure 6:
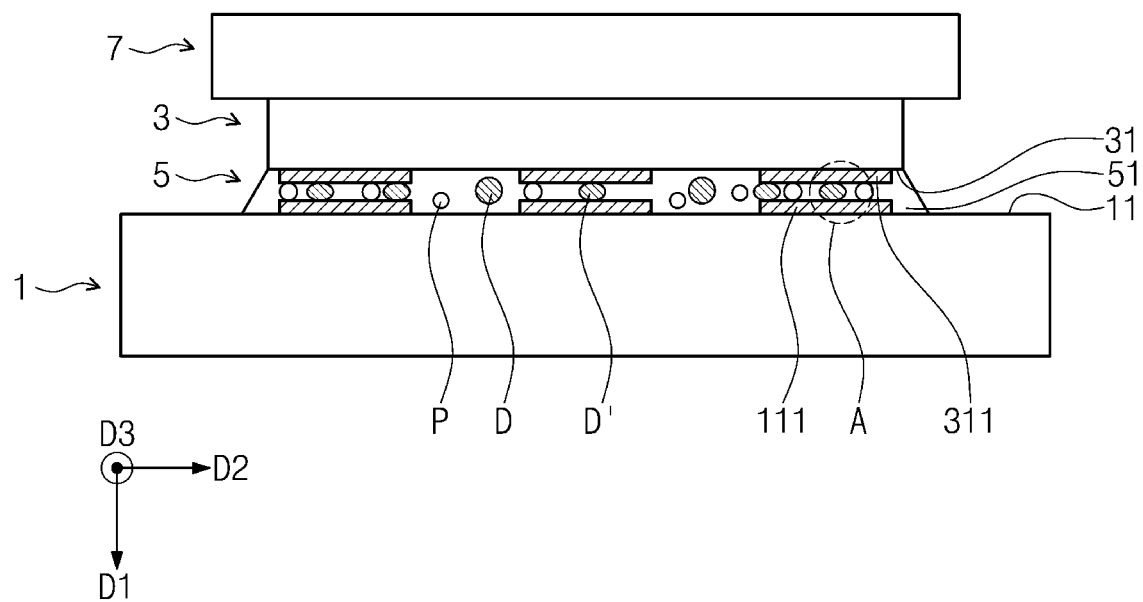

Referring to FIGS. 1 and 6, the shape of the adhesive layer 51 may be further changed through the pressing by the pressing part 7 and the heating by the laser L. The shape of the conductive particle D may vary. More specifically, the shape of the conductive particle D' located between the pad 311 of the bonding target 3 and the pad 111 of the substrate 1 may vary. A portion of the conductive particle D' may melt. A portion of the conductive particle D' may be bonded to the pad 311 of the bonding target 3. A portion of the conductive particle D' may be bonded to the pad 111 of the substrate 1. In embodiments, the adhesive layer 51 may be cured by the curing agent. The spacer P may withstand the pressing by the pressing part 7. The spacer P may maintain a distance between the pad 311 of the bonding target 3 and the pad 111 of the substrate 1. That is, even if the pressing part 7 presses the bonding target 3 in the first direction D1, the pad 311 of the bonding target 3 and the pad 111 of the substrate 1 may be spaced a predetermined distance apart from each other.

Figure 7:
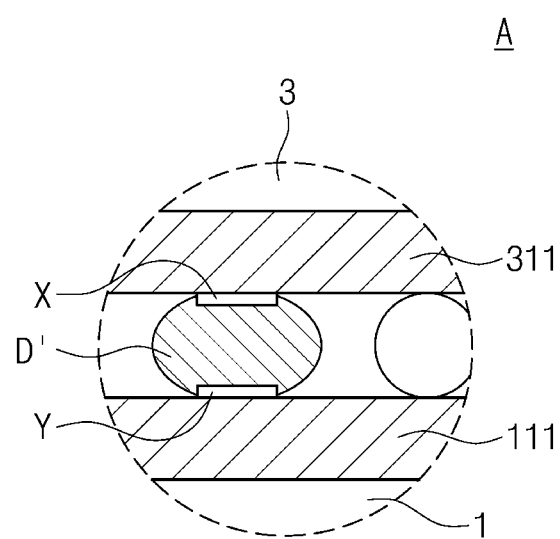

Referring to FIG. 7, the upper end of the conductive particle D' may be bonded to the pad 311 of the bonding target 3 to form an upper intermetallic compound X. The lower end of the conductive particle D' may be bonded to the pad 111 of the substrate 1 to form a lower intermetallic compound Y. The pad 311 of the bonding target 3 and the pad 111 of the substrate 1 may be electrically connected through the conductive particle D'. The pad 311 of the bonding target 3 and the pad 111 of the substrate 1 may be coupled through the conductive particle D'.

Figure 8:
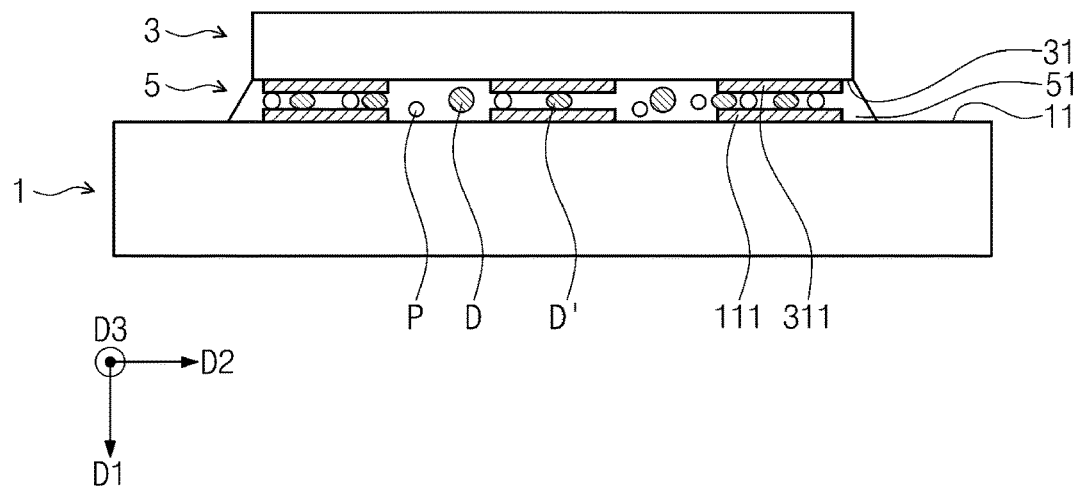
FIG. 8 is a cross-sectional view illustrating a semiconductor package bonded by the laser bonding method of FIG. 1.

FIG. 8 is a cross-sectional view illustrating a semiconductor package bonded by the laser bonding method of FIG. 1.

Referring to FIG. 8, in the removing of the pressing part (S5), the pressing part 7 may be removed. The semiconductor package bonded by the laser bonding method according to embodiments of the inventive concept may include the spacer P in the bonding part 5.

Through the laser bonding method according to the embodiments of the inventive concept, since the laser is used, the bonding process may be performed at a relatively low temperature. Also, the configuration of a substrate at a lower part may not need to be heated. Therefore, a low temperature solder having a melting point of a low temperature may be used. The substrate and the bonding target may be prevented from being heated at a high temperature. Therefore, the warpage phenomenon that may occur due to the difference in the coefficient of expansion (COE) of the substrate and/or the bonding target may be prevented. Also, the substrate and/or the bonding target may be prevented from being damaged by high temperature. Therefore, thinner parts may be used. Organic materials weak in heat may also be used easily. The yield of the process may be improved, and the manufacturing cost may be lowered. The energy used for heating may be saved.

According to the laser bonding method according to the embodiments of the inventive concept, since the conductive particles are dispersed in the bonding part in advance, a small size of solder may be easily formed. A small size of solder may be formed using a low temperature solder. Therefore, the size of the package may be reduced and the volume of the electronic product may be reduced. In addition, even if there are various surface treatments on the surface of the substrate, an easy bonding process may be possible.

By the laser bonding method according to the embodiments of the inventive concept, since it uses a spacer, the distance between the substrate 1 and the bonding target 3 may be maintained to be appropriate. Therefore, shape deformation of the conductive particle may be easily controlled. The difficulty of control required for pressing may be lowered. The shape after the bonding process may be maintained relatively constant.

Figure 9:
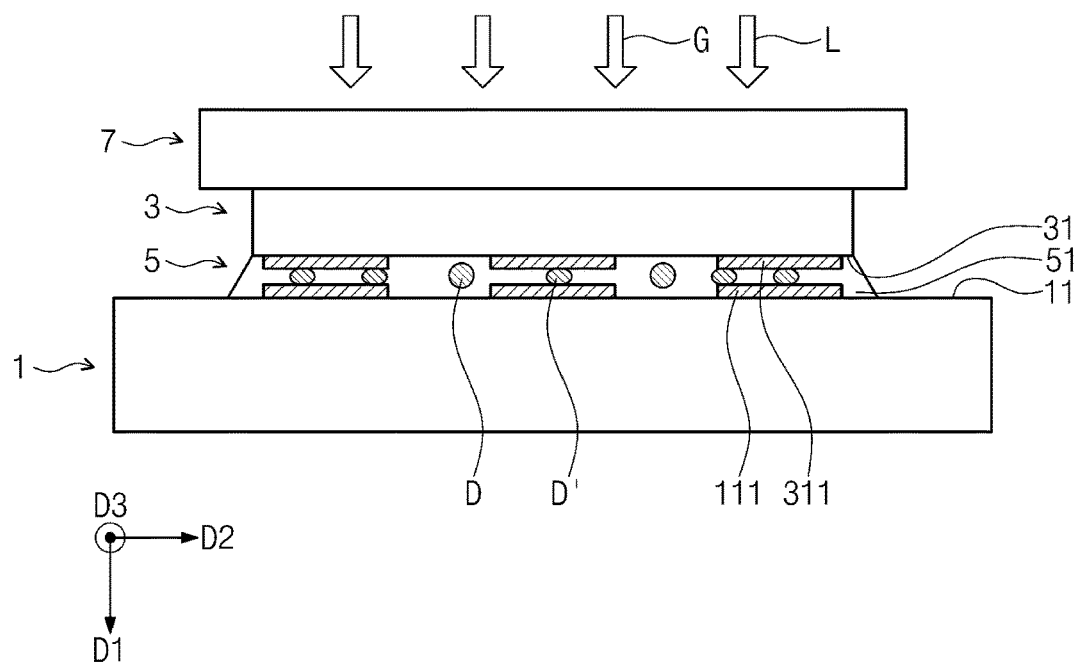
FIG. 9 is a cross-sectional view illustrating a laser bonding method according to embodiments of the inventive concept.

FIG. 9 is a cross-sectional view illustrating a laser bonding method according to embodiments of the inventive concept.

Hereinafter, the descriptions that are substantially identical or similar to those made with reference to FIGS. 1 to 8 may be omitted for convenience of explanation.

Referring to FIG. 9, a spacer may not be provided in the bonding part 5. Only the conductive material layer D may be provided in the bonding part 5. To perform the bonding process without a spacer, the pressing part 7 may press the bonding target 3 with an appropriate force. The displacement of the pressing part 7 in the first direction D1 should be properly controlled. The thickness of the bonding part 5 may be adjusted by controlling the displacement of the pressing part 7.

Figure 10:
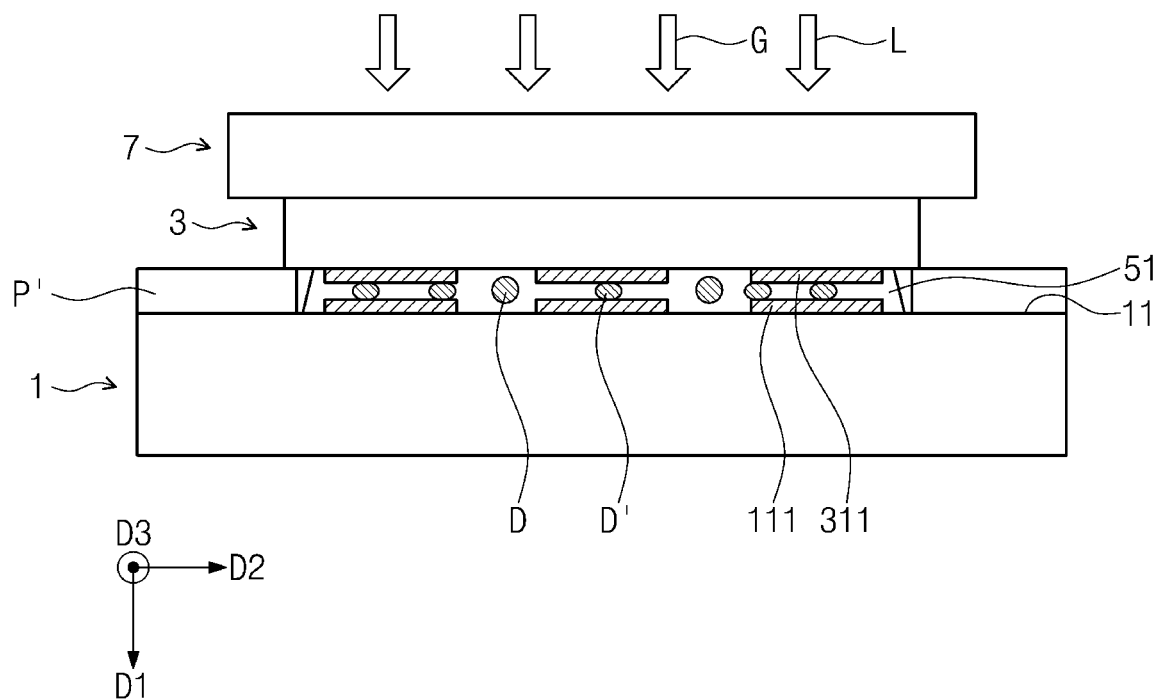
FIG. 10 is a cross-sectional view illustrating a laser bonding method according to embodiments of the inventive concept.

FIG. 10 is a cross-sectional view illustrating a laser bonding method according to embodiments of the inventive concept.

Hereinafter, the descriptions that are substantially identical or similar to those made with reference to FIGS. 1 to 9 may be omitted for convenience of explanation.

Referring to FIG. 10, a spacer P' may be provided on the upper surface 11 of a substrate 1. The spacer P' may be disposed at a position where the pads 111 and 311 are not located. The spacer P' may be placed in advance before placing the bonding part 5.

The spacer P' may include a material that is substantially the same as or similar to the spacer P (see FIG. 3) described with reference to FIG. 3. The spacer P' may withstand the pressing by the pressing part 7. By the spacer P', the bonding target 3 and the substrate 1 may maintain proper distance.

FIG. 11 is a cross-sectional view illustrating a laser bonding method according to embodiments of the inventive concept.

Hereinafter, the descriptions that are substantially identical or similar to those made with reference to FIGS. 1 to 10 may be omitted for convenience of explanation.

Referring to FIG. 11, a plurality of bonding targets 3, 3', and 3" may be provided on one substrate 1'. In embodiments, three bonding targets 3, 3', and 3" may be provided. The bonding targets 3, 3', and 3" may be spaced in the length direction of the substrate 1'. Each of the bonding targets 3, 3', and 3" may be bonded by substantially the same or similar method as that described with reference to FIGS. 1 to 10. That is, the pressing parts 7, 7', and 7" may be disposed on the respective bonding targets 3, 3', and 3" and pressed. Thus, each pressing may be made relatively uniform.

FIG. 12 is a cross-sectional view illustrating a laser bonding method according to embodiments of the inventive concept.

Hereinafter, the descriptions that are substantially identical or similar to those made with reference to FIGS. 1 to 11 may be omitted for convenience of explanation.

Referring to FIG. 12, the bonding targets 3, 3', and 3" spaced in the length direction of the substrate 1' may be pressed by one pressing part 7'''. Pressing may be performed at one time.

Through the laser bonding method according to the exemplary embodiment of the inventive concept, bonding at low temperatures may be possible.

Through the laser bonding method according to the exemplary embodiment of the inventive concept, a fine size solder may be bonded.

Through the laser bonding method according to the exemplary embodiment of the inventive concept, a warpage phenomenon may be prevented.

Through the laser bonding method according to the exemplary embodiment of the inventive concept, component damages due to heat may be prevented.

Although the exemplary embodiments of the inventive concept have been described, it is understood that the inventive concept should not be limited to these exemplary embodiments but various changes and modifications may be made by one ordinary skilled in the art within the spirit and scope of the inventive concept as hereinafter claimed.

What is claimed is:

1. A laser bonding method, comprising:
    forming a bonding part including an adhesive layer and a conductive particle disposed within the adhesive layer on a substrate;
    aligning a bonding target by disposing the bonding target on a surface of the bonding part opposite the substrate;
    disposing a pressing part on a surface of the bonding target that is opposite to the bonding part and pressing the bonding target onto the bonding part through the pressing part;
    heating the bonding target by irradiating at least the pressing part with a laser and conducting heat from the pressing part to the bonding target and from the bonding target to the bonding part; and
    bonding together the bonding part and the bonding target by the heat conducted from the bonding target to the bonding part so that the conductive particle electrically connects the substrate and the bonding target.

2. The method of claim 1, wherein a pad is disposed on the substrate and a pad is disposed on the bonding target in alignment with one another, and
    wherein the bonding together of the bonding target to the bonding part comprises:
        bonding an upper part of the conductive particle disposed within the adhesive layer to the bonding target pad; and
        bonding a lower part of the conductive particle disposed within the adhesive layer to the substrate pad.

3. The method of claim 2, wherein the conductive particle is provided in plurality.

4. The method of claim 2, wherein the bonding together of the upper part of the conductive particle to the bonding target pad comprises forming an upper intermetallic compound by the upper part of the conductive particle and the bonding target pad, and
    wherein the bonding together of the lower part of the conductive particle to the bonding target pad comprises forming a lower intermetallic compound by the lower part of the conductive particle and the bonding target pad.

5. The method of claim 1, further comprising removing the pressing part after bonding.

6. The method of claim 1, wherein the pressing part comprises quartz.

7. The method of claim 2, wherein the bonding part further comprises a spacer provided within the adhesive layer.

8. The method of claim 1, wherein the bonding part further comprises a reducing agent, and
    wherein the bonding together further comprises removing an oxide film from the conductive particle, a bonding target pad disposed on the bonding target, and a substrate pad disposed on the substrate, by contact thereof with the reducing agent.

9. The method of claim 1, wherein the conductive particle comprises a solder.

10. A laser bonding method, comprising:
   forming a bonding part including an adhesive layer and a spacer both disposed within the adhesive layer on a substrate;
   aligning a bonding target by disposing the bonding target on a surface of the bonding part opposite the substrate;
   disposing a pressing part on a surface of the bonding target that is opposite to the bonding part and pressing the bonding target onto the bonding part through the pressing part;
   heating the bonding target by irradiating at least the pressing part with a laser and conducting heat from the pressing part to the bonding target and from the bonding target to the bonding part; and
   bonding together the bonding part and the bonding target by the heat conducted from the bonding target to the bonding part.

11. The method of claim 10, wherein a pad is disposed on the substrate and a pad is disposed on the bonding target in alignment with one another, wherein the spacer is disposed between the pad of the bonding target and the pad of the substrate to maintain a distance therebetween.

12. The method of claim 10, wherein the spacer comprises a polymer, a ceramic, or a metal covered with an oxide film.

13. The method of claim 10, wherein the bonding part further comprises a conductive particle provided in the adhesive layer.

14. The method of claim 13, wherein a pad is disposed on the substrate and a pad is disposed on the bonding target, and
   wherein the bonding of the bonding target to the bonding part comprises:
   bonding an upper part of the conductive particle to the pad of the bonding target; and
   bonding a lower part of the conductive particle to the pad of the substrate.

15. The method of claim 14, wherein the bonding together of the upper part of the conductive particle to the pad of the bonding target comprises forming an upper intermetallic compound by the upper part of the conductive particle and by the pad of the bonding target, and
   wherein the bonding together of the lower part of the conductive particle to the pad of the substrate comprises forming a lower intermetallic compound by the lower part of the conductive particle and by the pad of the substrate.

* * * * *